(12) United States Patent
Best

(10) Patent No.: US 11,290,098 B2
(45) Date of Patent: *Mar. 29, 2022

(54) SYSTEM AND METHOD FOR CALIBRATION OF PULSE WIDTH MODULATION SIGNALS WITH HIGHER RESOLUTION INCREMENTS

(71) Applicant: TEXAS INSTRUMENTS INCORPORATED, Dallas, TX (US)

(72) Inventor: Eric Patrick Best, Howell, MI (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/001,410

(22) Filed: Aug. 24, 2020

(65) Prior Publication Data

US 2020/0389162 A1 Dec. 10, 2020

Related U.S. Application Data

(63) Continuation of application No. 16/689,411, filed on Nov. 20, 2019, now Pat. No. 10,756,717.

(60) Provisional application No. 62/770,423, filed on Nov. 21, 2018.

(51) Int. Cl.
*H03K 7/08* (2006.01)
*H04L 25/49* (2006.01)

(52) U.S. Cl.
CPC ........... *H03K 7/08* (2013.01); *H04L 25/4902* (2013.01)

(58) Field of Classification Search
CPC ....................................................... H03K 7/08
USPC ............................................................ 332/109
See application file for complete search history.

(56) References Cited

U.S. PATENT DOCUMENTS

| 2006/0214712 A1 | 9/2006 | O'Malley et al. |
| 2016/0142230 A1* | 5/2016 | Eliezer ................. H04B 1/0475 375/238 |
| 2016/0218703 A1* | 7/2016 | Nielsen .................... H03F 3/183 |
| 2019/0058397 A1 | 2/2019 | Lazaro et al. |

\* cited by examiner

*Primary Examiner* — Joseph Chang
(74) *Attorney, Agent, or Firm* — Charles F. Koch; Charles A. Brill; Frank D. Cimino

(57) ABSTRACT

A system and method for calibrating a pulse width modulation (PWM) signal that extends the on time by a higher resolution increment. The system comprises a PWM generator that receives a VDDIO rail to generate first and second PWM signals, the second PWM signal having an on time extended by the higher resolution increment having a commanded length. The system further comprises a VDDIO circuit that receives the VDDIO rail and outputs a VDDIO signal. First and second analog-to-digital converters are configured to generate a first and second sets of PWM samples and first and second sets of VDDIO samples. A microcontroller is configured to calculate an actual increment length based on the samples, and to compensate for a difference between the commanded length and the actual increment length.

20 Claims, 5 Drawing Sheets

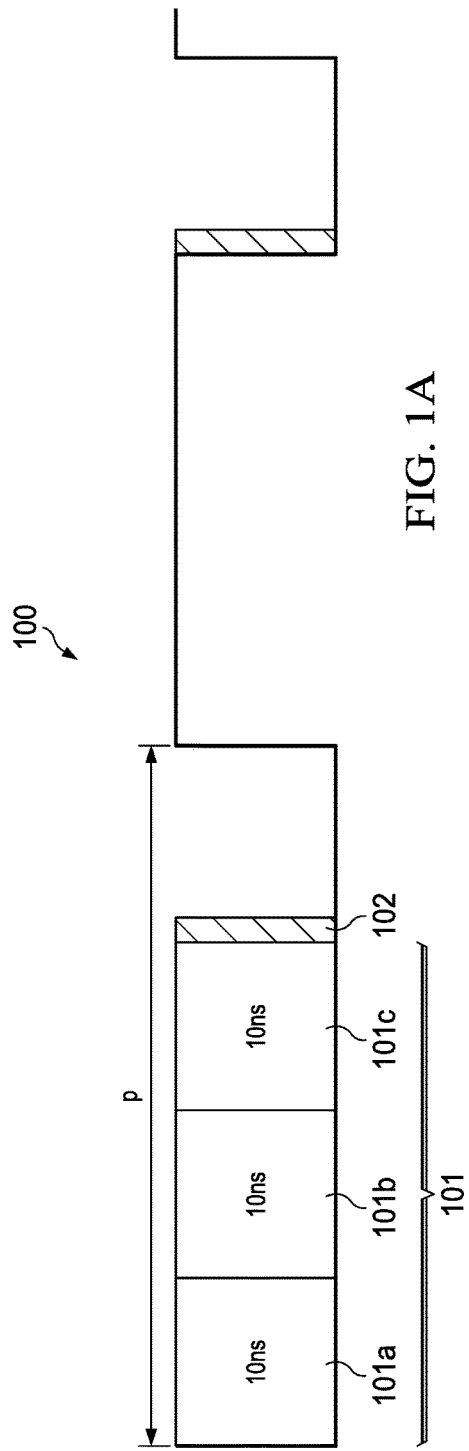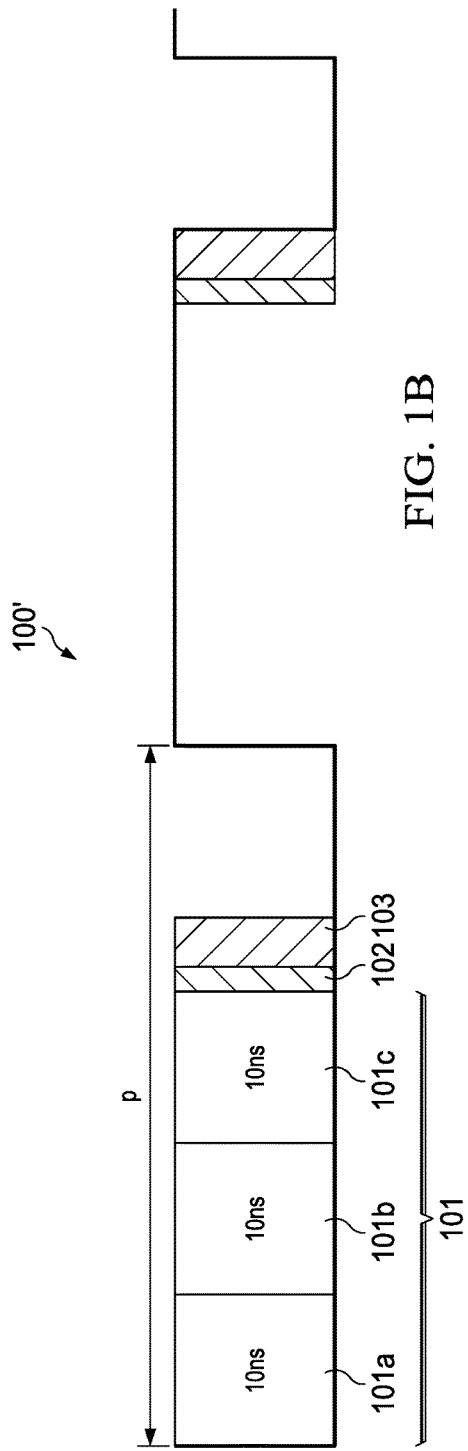

SYSTEM AND METHOD FOR CALIBRATION OF PULSE WIDTH MODULATION SIGNALS WITH HIGHER RESOLUTION INCREMENTS

CROSS REFERENCE TO RELATED APPLICATION

This application is a continuation of and claims priority to U.S. patent application Ser. No. 16/689,411, filed Nov. 20, 2019 and U.S. Patent Application No. U.S. Provisional Application No. 62/770,423, filed Nov. 21, 2018, both of which are incorporated by reference herein.

BACKGROUND

Pulse width modulation (PWM) signals have an "on" or high portion and an "off" or low portion. The length of the on portion, or "on time," of a PWM signal is generally based on the duty cycle, number indicating the percentage of a signal period that is on or high. For example, a 25 MHz signal with a 75% duty cycle has a period of 40 ns with 30 ns (i.e., 75% of 40 ns) being "on" and 10 ns being "off." The duty cycle, and therefore the on time of the signal, may generally be varied (increased or decreased) by an amount equal to the period of the internal clock of the PWM generator. For example, if the PWM generator has an internal dock of 100 MHz and thus a period of 10 ns, the duty cycle may be increased or decreased by increments of 10 ns. These 10 ns increments are referred to herein as lower resolution increments.

In some applications, however, there may be a need to more finely or precisely control a PWM signal so that the on time is increased or decreased with finer granularity than is possible using the available lower resolution increment. Such fine tuning may be accomplished by PWM generators capable of commanding the generator to add a higher resolution increment in the PWM signal, the higher resolution increment being of a higher resolution or granularity than the lower resolution increment. For example, where the lower resolution increment is 10 ns based on the internal clock of the PWM generator, it may be desirable to increase the on time by less than 10 ns (e.g., 1 ns).

The higher resolution increments added to PWM signals are subject to variance due to process, voltage, and temperature. Even at a fixed voltage and temperature, the higher resolution increments have individual variance due to silicon processes. Runtime calibration techniques are employed that provide an average higher resolution increment size, and therefore normalize the higher resolution increment in a given signal. These techniques, however, do not account for increment-to-increment variation or ensure the accuracy of a particular higher resolution increment.

Some applications, for example a Light Detection and Ranging (LiDAR) system, may require increased accuracy when determining the length of the higher resolution increment because a substantial variance may impact the accuracy of the resulting distance measurements. For example, if a 1 ns higher resolution increment is commanded to the laser driver of the LiDAR system, based on process variation, it may actually be 0.8 ns or 1.2 ns. This error may affect the robustness of the processing algorithms in some applications.

SUMMARY

Illustrative methods described herein include a method of calibrating a pulse width modulation (PWM) signal that includes using a VDDIO rail to generate a first PWM signal having an on time based on a duty cycle, the first PWM signal being generated without extending the on time by a commanded increment, and concurrently sampling the first PWM signal and the VDDIO rail to generate a first set of PWM samples and a first set of VDDIO samples. The method also includes generating a second PWM signal using the VDDIO rail, the second PWM signal being generated to extend the on time by the commanded increment having a commanded length, and concurrently sampling the second PWM signal and the VDDIO rail to generate a second set of PWM samples and a second set of VDDIO samples. The method further includes calculating an actual increment length based on the first and second sets of PWM samples and VDDIO samples, and compensating for a difference between the commanded increment length and the actual increment length.

Illustrative systems described herein include 11. A system for calibration of a pulse width modulation (PWM) signal that includes a generator configured to generate first and second PWM signals using a VDDIO rail, the first and second PWM signals each having an on time based on a duty cycle, the generator further configured to generate the first PWM signal without extending the on time by a commanded increment and to generate the second PWM signal by extending the on time by the commanded increment having a commanded length. The system also includes a VDDIO circuit that receives the VDDIO rail and outputs a VDDIO signal, and first and second analog-to-digital converters (ADCs) configured to concurrently sample the first PWM signal and the VDDIO signal, respectively, to generate a first set of PWM samples and a first set of VDDIO samples, respectively, to concurrently sample the second PWM signal and the VDDIO signal, respectively, and to generate a second set of PWM samples and a second set of VDDIO samples, respectively. The system further includes a microcontroller configured to calculate an actual increment length based on the first and second sets of PWM samples and VDDIO samples.

BRIEF DESCRIPTION OF THE DRAWINGS

For a detailed description of various examples, reference will now be made to the accompanying drawings in which:

FIGS. 1A and 1B illustrate examples of signals in accordance with the illustrative systems and methods described herein;

DETAILED DESCRIPTION

Figure 2:
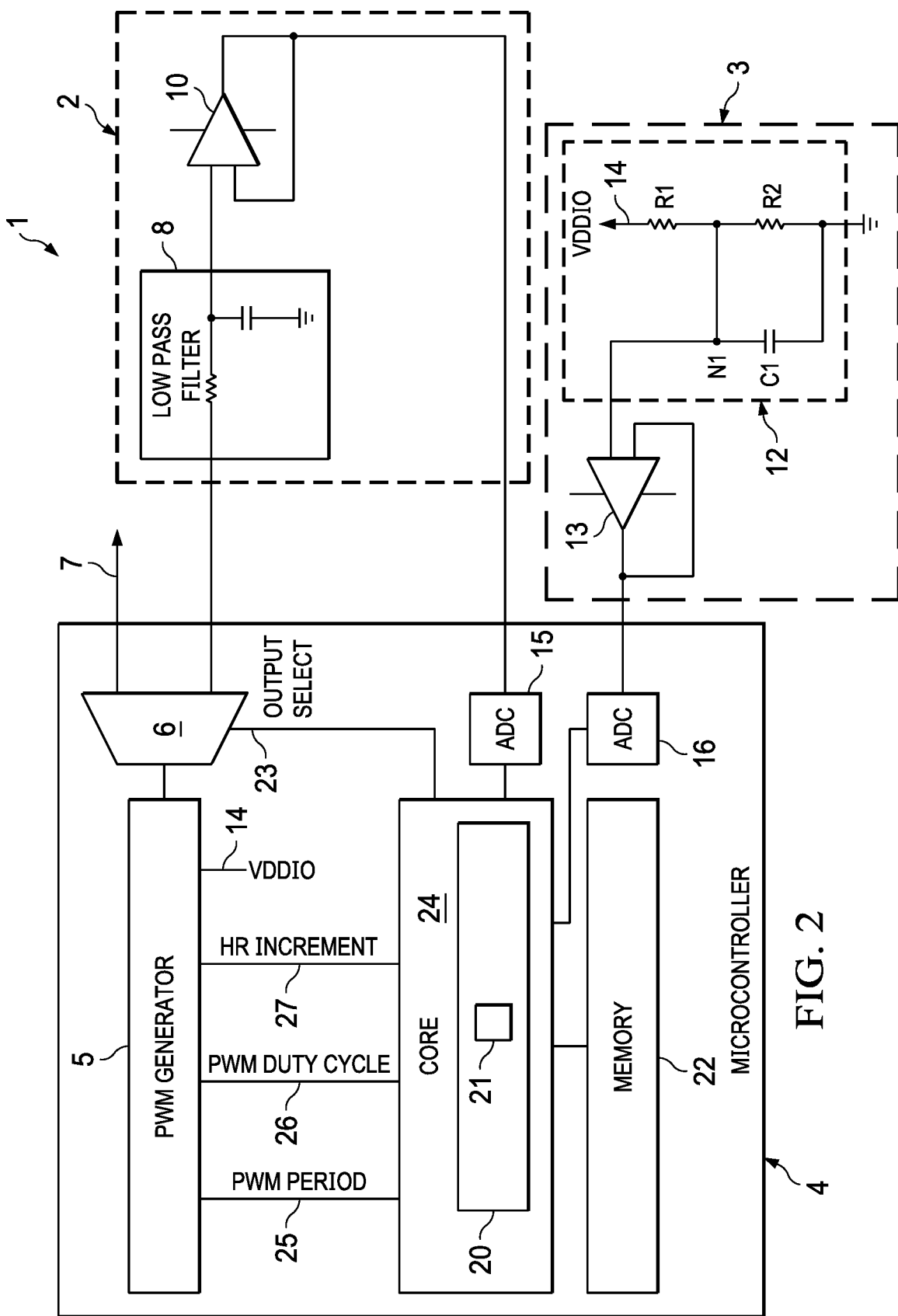
FIG. 2 illustrates an example PWM signal calibration system described herein.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

FIGS. 1A and 1B show illustrative PWM signals 100 and 100', respectively. Both signals 100 and 100' may have a high frequency to facilitate filtering, for example 25 MHz. Both signals 100 and 100' have a period p. In the case of a 25 MHz signal, the period for both signals 100 and 100' would be 40 ns. Both signals 100 and 100' include lower resolution portion 101 having lower resolution increments 101a, 101b, 101c, which may be, for example, 10 ns. Both signals 100 and 100' may also include in-band noise portion 102. In-band noise portion 102 may include, for example, jitter and/or slew rate. Unlike PWM signal 100, the on time of PWM signal 100' has been increased or extended by higher resolution increment 103, which has a length less than the length of any one of lower resolution increments 101a, 101b, 101c.

Figure 3:
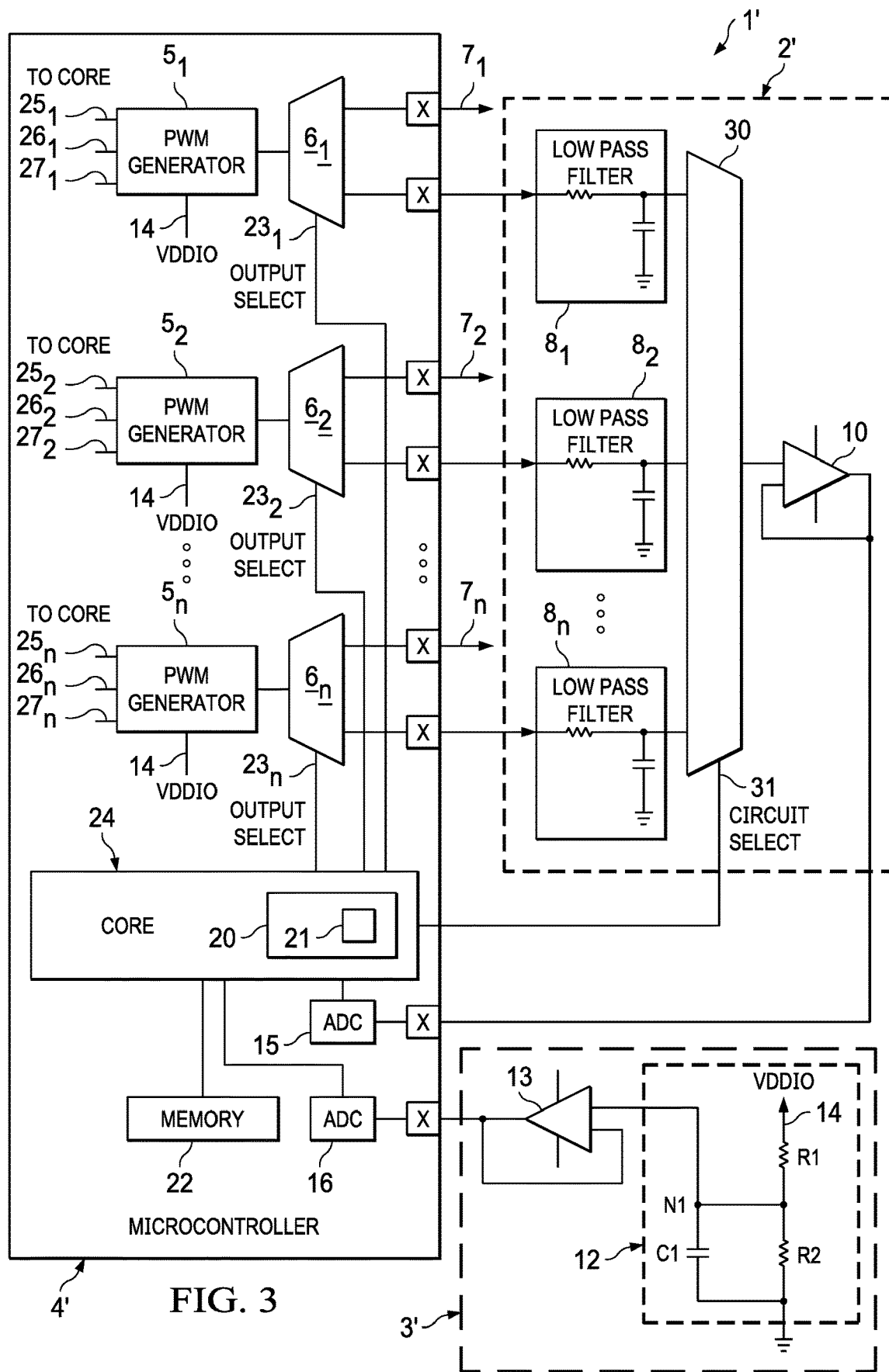
FIG. 3 illustrates an example PWM signal calibration system described herein.
Figure 4:
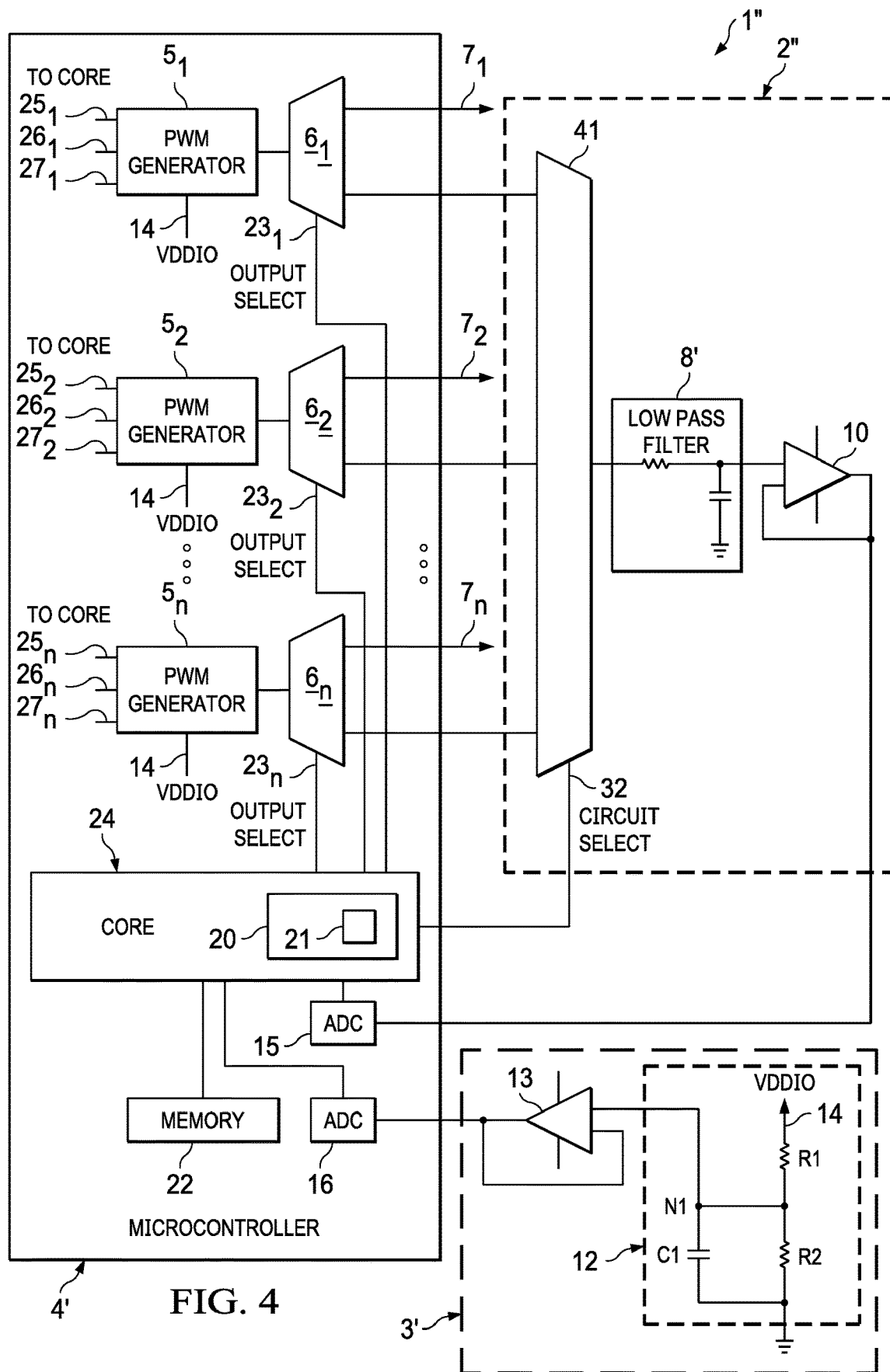
FIG. 4 illustrates an example PWM signal calibration system described herein.

Because some applications, for example LiDAR, require increased accuracy, it is often important to calibrate the higher resolution increments (e.g., 103) to ensure that they are accurate and/or that any inaccuracies can be measured and accounted for. FIGS. 2-4 show examples of PWM signal calibration systems that perform such calibrations.

In example calibration system 1 of FIG. 2, the PWM signal calibration system 1 includes a microcontroller 4, a signal calibration circuit 2, and a VDDIO measurement circuit 3. The example microcontroller 4 includes a PWM generator 5. PWM generator 5 is coupled to a VDDIO rail 14 to receive a VDDIO voltage to generate PWM signals (e.g., PWM signals 100 and 100') by generating a base signal and a carrier signal and modulating the base signal with a carrier signal. Microcontroller 4 also includes core 24, which includes and firmware 20 having software 21. Core 24 controls PWM generator 5 to generate PWM signals (e.g., PWM signals 100 and 100') by providing values for, for example, a PWM period, a PWM duty cycle percentage representing the lower resolution portion 101 as a percentage of the period p and a higher resolution increment (the amount by which to increase the duty cycle) using PWM period input line 25, duty cycle input line 26 and higher resolution increment input line 27. Microcontroller 4 in this example also includes demultiplexer 6, which allows switching of the output of PWM generator 5 between an operational signal application path 7 and a signal calibration circuit 2 based on an output select signal 23 received from the core 24. Demultiplexer 6 may be an internal pin mux, which is a hardware component that routes a signal on an input pin to one of many output pins. Demultiplexer 6 may be provided as part of the microcontroller 4 or may be external to the microcontroller 4. Microcontroller 4 also includes memory 22.

Signal calibration circuit 2 is coupled to the microcontroller 4 and includes a low pass filter 8 which may, for example, filter out high-frequency noise (different from in-band noise 102) and the carrier frequency of the signal (e.g., PWM signals 100 or 100'). The high-frequency noise filtered out by low pass filter 8 may be, for example, a variance in the duty cycle. Low pass filter 8 may also perform digital to analog conversion of the signal. Low pass filter 8 may be a pulse width modulation digital-to-analog converter (PWM DAC) and may convert the signal (e.g., PWM signals 100 or 100') to a continuously variable analog signal by filtering out the carrier frequency. Low pass filter 8 may be passive or active.

Signal calibration circuit 2 also includes a unity gain buffer 10 which may, for example, reduce errors due to impedance mismatch. The output of the unity gain buffer 10 is coupled to an analog-to-digital converter (ADC) 15 in the microcontroller 4. The unity gain buffer 10 may have a lower output impedance than low pass filter 8, and thus by including the unity gain buffer 10 in the signal path between the low pass filter 8 and the ADC 15, the accuracy of the ADC 15 is improved. For example, driving ADC 15, which may have its own input impedance, with a high impedance signal (e.g., directly from the low pass filter 8) may increase errors in the ADC 15. By instead driving the input of the ADC 15 with a lower output impedance unity gain buffer 10, errors in ADC 15 may be reduced.

The VDDIO measurement circuit 3 is usable to measure the VDDIO voltage from the VDDIO rail 14 used by the PWM generator 5 to generate the PWM signals 100 and 100'. The measured VDDIO voltage may be used to isolate the values of the commanded signal in PWM signals 100 and 100', and to determine the value of in-band noise 102 and higher resolution increment 103, as described in more detail below with respect to FIG. 5. The VDDIO measurement circuit 3 includes low pass filter 12, which may comprise resistors R1 and R2 and capacitor C1. Resistors R1 and R2 may comprise a voltage divider. In the example of FIG. 2, R1 is connected to R2 and to C1 at a node N1. The node N1 represents the output signal of the low pass filter 12. Low pass filter 12 has an equivalent magnitude response and phase response to low pass filter 8 in the signal calibration circuit 2 such that it filters the same frequency range (e.g., high frequency noise) as low pass filter 8. For example, the resistors R1, R2 of low pass filter 12 should be sized such that low pass filter 12 has an equivalent 3 dB corner frequency as low pass filter 8. Low pass filter 12 is coupled between VDDIO rail 14 and unity gain buffer 13, which is equivalent to the unity gain buffer 10 in the signal calibration circuit 2. The output of unity gain buffer 13 is coupled to ADC 16 in microcontroller 4. ADCs 15 and 16 may be internal to, or external from, microcontroller 4.

FIG. 3 shows another example of a PWM signal calibration system 1'. In this example, the PWM signal calibration system 1' includes a microcontroller 4', a signal calibration circuit 2', and a VDDIO measurement circuit 3. Microcontroller 4' of PWM signal calibration system 1' includes PWM generators $5_1$, $5_2$, . . . $5_n$, which are each controlled by respective PWM period input lines ($25_1$, $25_2$, . . . $25_n$), duty cycle input lines ($26_1$, $26_2$, . . . $26_n$) and higher resolution increment input line ($27_1$, $27_2$, . . . $27_n$) coupled to the core 24. The respective outputs of the PWM generators $5_1$, $5_2$, . . . $5_n$ are coupled to demultiplexers $6_1$, $6_2$, . . . $6_n$. Each demultiplexer $6_1$, $6_2$, . . . $6_n$ allows switching of the output of respective PWM generator $5_1$, $5_2$, . . . $5_n$ between a respective operational signal application path $7_1$, $7_2$, . . . $7_n$ and a respective low pass filter $8_1$, $8_2$, . . . $8_n$ in signal calibration circuit 2' based on a respective output select signal $23_1$, $23_2$, . . . $23_n$ provided by core 24. Each demultiplexer $6_1$, $6_2$, . . . $6_n$ may be an internal pin mux and may be provided as part of the microcontroller 4' or may be external to the microcontroller 4'. Each PWM generator $5_1$, $5_2$, . . . $5_n$ and/or demultiplexer $6_1$, $6_2$, . . . $6_n$ may be inside or outside microcontroller 4'. VDDIO measurement circuit 3 may be identical to the VDDIO measurement circuit 3 of FIG. 2.

Signal calibration circuit 2' includes a multiplexer 30 that selectively couples each low pass filter $8_1$, $8_2$, . . . $8_n$ to unity gain buffer 10. Based on a circuit select signal 31 provided by core 24 of microcontroller 4, multiplexer 30 will provide to unity gain buffer 10 the signal generated by one of PWM generators $5_1$, $5_2$, . . . $5_n$ and provided to respective the low pass filter $8_1$, $8_2$, . . . $8_n$. Thus, the PWM signal calibration system 1' uses multiplexer 30 to allow multiple PWM generators ($5_1$, $5_2$, ... $5_n$) to be calibrated using microcontroller 4 and VDDIO measurement circuit 3.

FIG. 4 shows another example of a PWM signal calibration system 1". In this example, the PWM signal calibration system 1" includes a microcontroller 4', a signal calibration circuit 2", and a VDDIO measurement circuit 3. Microcontroller 4' may be identical to microcontroller 4' of FIG. 3 and includes PWM generators $5_1$, $5_2$, ... $5_n$, which are each controlled by respective PWM period input lines ($25_1$, $25_2$, ... $25_n$), duty cycle input lines ($26_1$, $26_2$, ... $26_n$) and higher resolution increment input line ($27_1$, $27_2$, ... $27_n$) coupled to the core 24. The respective outputs of the PWM generators $5_1$, $5_2$, ... $5_n$ are coupled to demultiplexers $6_1$, $6_2$, ... $6_n$. Each demultiplexer $6_1$, $6_2$, ... $6_n$ allows switching of the output of respective PWM generator $5_1$, $5_2$, ... $5_n$ between a respective operational signal application path $7_1$, $7_2$, ... $7_n$ and signal calibration circuit 2" based on a respective output select signal $23_1$, $23_2$, ... $23_n$ provided by core 24.

Signal calibration circuit 2" includes multiplexer 41, low pass filter 8 and unity gain buffer 10. Multiplexer 41 receives the outputs of each demultiplexer $6_1$, $6_2$, ... $6_n$ as inputs and selectively outputs one of these inputs based on circuit select signal 32 provided by core 24 of microcontroller 4. Low pass filter 8 couples the output of multiplexer 41 to unity gain buffer 10. Each demultiplexer $6_1$, $6_2$, ... $6_n$ may be an internal pin mux and may be provided as part of the microcontroller 4' or may be external to the microcontroller 4'. Each PWM generator $5_1$, $5_2$, ... $5_n$ and/or demultiplexer $6_1$, $6_2$, ... $6_n$ may be inside or outside microcontroller 4'. VDDIO measurement circuit 3 is the same as the VDDIO measurement circuit 3 of FIGS. 2 and 3.

PWM signal calibration signal 1" is similar to PWM signal calibration signal 1' except the multiplexer in PWM signal calibration signal 1" is placed before the low pass filter. In this way, PWM signal calibration signal 1" allows for multiple PWM generators ($5_1$, $5_2$, ... $5_n$) while also eliminating the need for multiple low pass filters.

Figure 5:
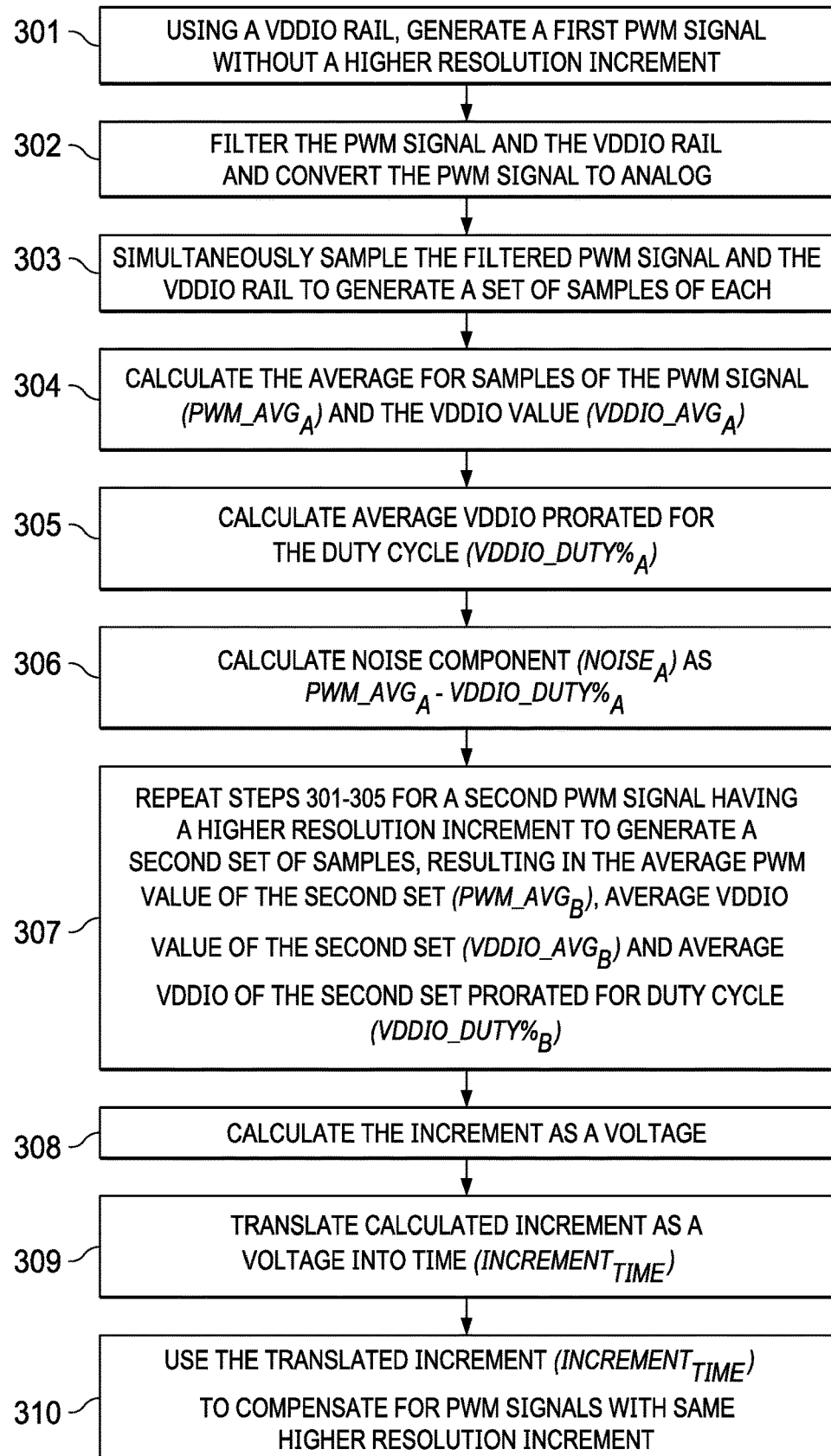
FIG. 5 illustrates an example method for calibrating a PWM signal described herein.

FIG. 5 shows an illustrative method for calibrating a PWM signal (e.g., signal 100' of FIG. 1B) having its on time increased or extended by a higher resolution increment (e.g., 103 of FIG. 1B) using, for example, the PWM signal calibration system 1 of FIG. 2, but applicable as well to PWM signal calibration systems 1' (FIGS. 3) and 1" (FIG. 4). At step 301, PWM generator 5 generates a first PWM signal 100 that includes an on time specified in lower resolution increments (e.g., increments 101a, 101b, and/or 101c), which may include in-band noise 102, but does not include a higher resolution increment to increase the on time. PWM generator 5 may generate signal 100 based on a VDDIO voltage provided by VDDIO rail 14 and input received from core 24 on one or more of PWM period input line 25, duty cycle input line 26 and higher resolution increment input line 27. The signal 100 has a duty cycle, which may be any duty cycle, for example a 75% duty cycle. The signal may be, for example, a 25 MHz signal with a period of 40 ns. At step 302, the low pass filter 8 filters out, for example, high frequency noise and the carrier frequency, and converts the PWM signal 100 to an analog signal, and low pass filter 12 filters VDDIO rail 14 to remove the same noise components removed by low pass filter 8.

At step 303, ADCs 15 and 16 concurrently sample the filtered first PWM signal 100 and the filtered VDDIO rail, respectively, to generate a set of samples (A) of each respective signal/voltage. The sampling rate implemented by the ADCs 15, 16 is sufficiently high to satisfy the Nyquist Theorem. For example, the sampling rate may be at least 2 times the frequency of the low pass filtered signals' analog bandwidth. An example would be 128 samples at a sampling rate of 1 Msamples/second. The sampling rate may be sufficiently high to allow for proper sampling and accounting for the waveform's AC characteristics. For example, if the low pass filter 8 has a −70 dB cutoff at 200 KHz, and the ADC 15 is capable of 70 dB effective resolution, then the sampling rate may be greater than or equal to 400 Ksamples/second.

At step 304 in the example of FIG. 4, core 24 of the microcontroller 4 calculates an average voltage of the samples of the first PWM signal (PWM_AVG$_A$) and an average of the set of samples of VDDIO (VDDIO_AVG$_A$). PWM_AVG$_A$ represents the sum of the measured lower resolution portion 101 and in-band noise 102 of the PWM signal 100 generated at step 301. In the illustrative filter 12 of FIG. 2, ADC 16 samples VDDIO at N1 as divided by R1 and R2. Thus, the sampled VDDIO voltage may be first modified to compensate for the divided voltage. For example, if the voltage divider (R1 and R2) divides the VDDIO in half, core 24 of microcontroller 4 will double the sampled VDDIO voltage to compensate for the divided voltage and will then calculate the average of the compensated values.

At step 305, core 24 of the microcontroller 4 prorates the calculated average VDDIO (VDDIO_AVG$_A$) based on the duty cycle, as specified by the core 24 on duty cycle input line 26, to obtain a duty-cycle-prorated average VDDIO (VDDIO_DUTY%$_A$) by using the following equation:

$$\text{VDDIO\_DUTY\%}_A = \text{duty\_cycle\_percentage} \times \text{VDDIO\_AVG}_A$$

VDDIO DUTY%$_A$ represents the intended or commanded value of the on time or lower resolution portion 101 of PWM signal 100 because the VDDIO rail 14 was used by PWM generator 5 to determine the amplitude of the on time or lower resolution portion 101. VDDIO DUTY%$_A$, however, will not include the in-band noise 102. duty_cycle_percentage is the lower resolution portion 101 as a percentage of p of signal 100, as specified by the core on duty cycle input line 26. duty_cycle_percentage may be a parameter stored in memory 22 and may be provided by core 24 to PWM generator 5 by duty cycle input line 26. At step 306, core 24 of the microcontroller 4 calculates the in-band noise component 102 (NOISE$_A$) of PWM signal 100 by subtracting the average commanded value (VDDIO_DUTY%$_A$) from the average measured value (PWM_AVG$_A$), which as described above includes both the measured on time 101 and in-band noise 102. The noise may be calculated using the following equation:

$$\text{NOISE}_A = \text{PWM\_AVG}_A - \text{VDDIO\_DUTY\%}_A$$

At step 307, repeat steps 301-305 for the PWM signal 100'. To generate PWM signal 100', core 24 will provide the same PWM period and PWM duty cycle on PWM period input line 25 and duty cycle input line 26 that it provided for PWM signal 100. Unlike with signal 100, for signal 100' core 24 will also provide a value for the higher resolution increment on higher resolution increment input line 27. Signal 100' has lower resolution portion 101 specified by the same lower resolution increments (e.g., the same of increments 101a, 101b, and/or 101c) as PWM signal 100 and includes substantially similar in-band noise 102 effects. The on time of PWM signal 100', however, is extended by a commanded higher resolution increment 103 as specified by the core 24 on higher resolution increment input line 27.

Repeating steps 301-305 for PWM signal 100' will generate a set (B) of samples of PWM signal 100' and a second set of samples of VDDIO voltage, resulting in an average PWM voltage value of the second set (PWM_AVG$_B$), average VDDIO value of the second set (VDDIO_AVG$_B$) and average VDDIO of the second set prorated for the duty cycle of PWM signal 100 (VDDIO_DUTY%$_B$). PWM_AVG$_B$ represents the sum of the measured value of lower resolution portion 101, the measured value of higher resolution increment 103 and in-band noise 102 of the PWM signal 100'.

At step 308, the core 24 of the microcontroller 4 calculates the difference in the average voltage of the PWM signal 100' caused by the higher resolution increment 103 by subtracting the lower resolution portion 101 (represented by VDDIO_DUTY%$_B$) and the in-band noise component 102 from the average value of the samples of PWM signal 100' (PWM_AVG$_B$), for example, by using the following equation:

$$\text{Increment}_{voltage} = \text{PWM\_AVG}_B - \text{VDDIO\_DUTY\%}_B - \text{NOISE}_A$$

At step 309, the core 24 of the microcontroller 4 translates the increment as a voltage into time (Increment$_{time}$), which corresponds to the duration of higher resolution increment 103, by using the following equation:

$$\text{Increment}_{time} = (\text{Increment}_{voltage}/\text{VDDIO\_AVG}_B) \times \text{Period}$$

where Period is the period p of the PWM signal 100' of FIG. 1B (e.g., 40 n s). The calculated increment Increment$_{time}$ may be stored in memory 22 with the commanded increment. At step 310, the calculated increment is used in future uses of PWM generator 5 to generate a PWM signal with the same commanded higher resolution increment 103 for use on operational signal application path 7. For example, the calculated increment may be used to update a transfer function or lookup table stored in memory 22 associated with a higher resolution increment value (e.g., 103) such that next time a PWM signal with that the specified higher resolution increment is generated, the core 24 can command a higher resolution increment on higher resolution increment input line 27 that compensates for the difference. As another example, if a 1 ns increment is commanded, but the calibration reveals that the PWM generator 5 actually generates a .8 ns or 1.2 ns increment, the core 24 can compensate for the difference and attempt to generate a higher resolution increment that is closer to 1 ns by commanding a slightly higher or lower higher resolution increment on higher resolution increment input line 27. Alternatively, a reader/receiver of the PWM signal can compensate for the difference. For example, the reader/receiver can know to expect a .8 ns or 1.2 ns increment rather than a 1 ns increment, and compensate accordingly.

The process of FIG. 5 may be performed for other higher resolution increment values. The process of FIG. 5 may be repeated multiple times, and the results averaged to increase the accuracy of the calibration. The steps above described as being performed by microcontroller 4 may be performed by executing firmware 20 having software 21. The process of FIG. 5 may be performed for example, during or after manufacture, at startup and/or during runtime (e.g., at regular intervals).

Modifications are possible in the described embodiments, and other embodiments are possible, within the scope of the claims.

What is claimed is:

1. A method comprising:
   generating a first pulse width modulation (PWM) signal based on a voltage, the first PWM signal having a first on time;
   sampling the first PWM signal and the voltage to generate a first set of PWM samples and a first set of voltage samples;
   generating a second PWM signal based on the voltage, the second PWM signal having a second on time, wherein the second on time includes the first on time extended by an increment length;
   sampling the second PWM signal and the voltage to generate a second set of PWM samples and a second set of voltage samples; and
   determining an offset for the increment length based on the first and second sets of PWM samples and voltage samples.

2. The method of claim 1, further comprising:
   determining an adjusted increment length based on the offset.

3. The method of claim 2, further comprising:
   generating a third PWM signal based on the first on time extended by the adjusted increment length.

4. The method of claim 1, further comprising:
   low pass filtering the first PWM signal, the second PWM signal and the voltage.

5. The method of claim 4, wherein:
   the low pass filtering performs digital to analog conversion.

6. The method of claim 4, wherein:
   the low pass filtering includes active filtering.

7. The method of claim 1, wherein:
   generating the first and second PWM signals is further based on a period and a duty cycle.

8. The method of claim 1, wherein:
   the first and second sets of voltage samples are taken from an output of a voltage divider; and
   the first and second sets of voltage samples are adjusted based on the voltage divider.

9. The method of claim 1, further comprising:
   outputting the offset to a PWM receiver.

10. The method of claim 1, further comprising:
    storing the offset in a memory;
    retrieving the offset from the memory;
    determining an adjusted increment length based on the offset; and
    generating a third PWM signal based on the first on time extended by the adjusted increment length.

11. An integrated circuit device comprising:
    a microcontroller configured to:
    receive a voltage;
    generate first and second pulse width modulation (PWM) signals based on the voltage, the first and second PWM signals having a first and second on time, respectively, wherein the second on time is configured to be extended by an increment length;
    sample the first PWM signal and the voltage, respectively, to generate a first set of PWM samples and a first set of voltage samples, respectively;
    sample the second PWM signal and the voltage, respectively, to generate a second set of PWM samples and a second set of voltage samples, respectively; and
    calculate an offset for the increment length based on the first and second sets of PWM samples and voltage samples.

12. The integrated circuit device of claim 11, wherein:
    the microcontroller includes first and second analog to digital converters configured to sample the first and second PWM signals and the voltage.

13. The integrated circuit device of claim 11, wherein:

the microcontroller is configured to:

determine a period for the first and second PWM signals;

determine a duty cycle for the first and second PWM signals; and determine the increment length for the second PWM signal.

14. The integrated circuit device of claim 13, wherein:

the microcontroller includes a plurality of PWM generators, wherein each PWM generator is controlled by a period input line, a duty cycle input line, and an increment input line.

15. The integrated circuit device of claim 14, wherein:

the microcontroller includes a demultiplexer configured to switch an output of each of the plurality of PWM generators between a PWM application path and a PWM calibration circuit.

16. The integrated circuit device of claim 11, wherein:

the microcontroller is configured to determine an adjusted increment length based on the offset.

17. The integrated circuit device of claim 16, wherein:

the microcontroller is configured to generate a third PWM signal having a third on time extended by the adjusted increment length.

18. The integrated circuit device of claim 11, wherein:

the microcontroller includes a memory.

19. The integrated circuit device of claim 18, wherein:

the microcontroller is configured to:

store the offset in the memory;

retrieve the offset from the memory;

determine an adjusted increment length based on the offset; and generate a third PWM signal having a third on time extended by the adjusted increment length.

20. The integrated circuit device of claim 11, wherein:

the microcontroller is configured to:

output the offset to a PWM receiver.

\* \* \* \* \*